(12) United States Patent
Kellock et al.

(10) Patent No.: US 8,404,589 B2
(45) Date of Patent: Mar. 26, 2013

(54) SILICIDE CONTACT FORMATION

(75) Inventors: Andrew J. Kellock, Sunnyvale, CA (US); Christian Lavoie, Pleasantville, NY (US); Ahmet Ozcan, Pleasantville, NY (US); Stephen Rossnagel, Pleasantville, NY (US); Bin Yang, Ossining, NY (US); Zhen Zhang, Ossining, NY (US); Yu Zhu, West Harrison, NY (US); Stefan Zollner, Hopewell Junction, NY (US)

(73) Assignees: International Business Machines Corporation, Armonk, NY (US); Globalfoundries Inc. (KY)

( * ) Notice: Subject to any disclaimer, the term of this patent is extended or adjusted under 35 U.S.C. 154(b) by 59 days.

(21) Appl. No.: 12/754,912

(22) Filed: Apr. 6, 2010

(65) Prior Publication Data

US 2011/0241213 A1 Oct. 6, 2011

(51) Int. Cl.
*H01L 21/44* (2006.01)
(52) U.S. Cl. ........ 438/686; 438/651; 438/682; 438/664; 438/655; 257/E21.165
(58) Field of Classification Search .................. 438/650, 438/651, 682, 686, 664, 665; 257/E21.165
See application file for complete search history.

(56) References Cited

U.S. PATENT DOCUMENTS

| | | | | |
|---|---|---|---|---|
| 6,507,123 B1 * | 1/2003 | Woo et al. | ...................... | 257/401 |
| 6,531,396 B1 * | 3/2003 | Chi et al. | ...................... | 438/682 |
| 6,534,871 B2 * | 3/2003 | Maa et al. | ...................... | 257/769 |
| 7,030,451 B2 * | 4/2006 | Lee et al. | ...................... | 257/413 |
| 7,560,331 B2 * | 7/2009 | Kim et al. | ...................... | 438/230 |
| 7,638,427 B2 * | 12/2009 | Froment et al. | ............... | 438/649 |
| 7,935,632 B2 * | 5/2011 | Tong et al. | ................... | 438/682 |
| 2003/0104694 A1 * | 6/2003 | Maa et al. | ...................... | 438/682 |
| 2005/0202673 A1 * | 9/2005 | Chi et al. | ....................... | 438/655 |
| 2005/0236715 A1 * | 10/2005 | Ku et al. | ........................ | 257/768 |
| 2008/0197498 A1 * | 8/2008 | Kaushik et al. | ................ | 257/754 |
| 2008/0299769 A1 * | 12/2008 | Huang et al. | ................... | 438/669 |
| 2009/0114997 A1 * | 5/2009 | Tong et al. | ..................... | 257/384 |
| 2009/0191707 A1 * | 7/2009 | Okada et al. | .................. | 438/664 |

* cited by examiner

*Primary Examiner* — Nitin Parekh
(74) *Attorney, Agent, or Firm* — Cantor Colburn LLP; Louis Percello (57) ABSTRACT

A method for forming a silicide contact includes depositing a metal layer on silicon such that the metal layer intermixes with the silicon to form an intermixed region on the silicon; removing an unintermixed portion of the metal layer from the intermixed region; and annealing the intermixed region to form a silicide contact on the silicon. A semiconductor device comprising a silicide contact located over a silicon layer of the semiconductor device, the silicide contact comprising nickel (Ni) and silicon (Si) and having Ni amount equivalent to a thickness of about 21 angstroms or less.

13 Claims, 9 Drawing Sheets

100

DEPOSIT METAL LAYER ON SILICON
101

INTERMIXED REGION FORMS BETWEEN METAL LAYER AND SILICON
102

REMOVE UNINTERMIXED METAL, LEAVING INTERMIXED REGION ON SILICON
103

ANNEAL INTERMIXED REGION TO FORM SILICIDE CONTACT
104

| SILICIDE CONTACT |
| 501 |
| |
| SILICON |
| 201 |

SILICIDE CONTACT FORMATION

FIELD

This disclosure relates generally to the field of formation of silicide contacts for semiconductor devices.

DESCRIPTION OF RELATED ART

A semiconductor device, such as a field effect transistor (FET), may comprise one or more contacts that are used to apply electrical voltage to the semiconductor device in order to power the device. As semiconductor devices become smaller and smaller, the contacts also need to be made commensurately thinner in size. Semiconductor devices comprising 3-dimensional structures may also require conformal formation of ultra-thin silicide contacts.

SUMMARY

In one aspect, a method for forming a silicide contact includes depositing a metal layer on silicon such that the metal layer intermixes with the silicon to form an intermixed region on the silicon; removing an unintermixed portion of the metal layer from the intermixed region; and annealing the intermixed region to form a silicide contact on the silicon.

In one aspect, a semiconductor device comprising a silicide contact located over a silicon layer of the semiconductor device, the silicide contact comprising nickel (Ni) and silicon (Si) and having Ni amount equivalent to a thickness of about 21 angstroms or less.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of silicide contacts and methods of forming silicide contacts are provided, with exemplary embodiments being discussed below in detail. A contact for a semiconductor device may comprise a layer of silicide. Semiconductor device scaling requires silicide contact scaling, which calls for formation of extremely thin silicide films for use as contacts. A silicide contact may be formed by sputtering of metal on silicon, annealing to cause the metal and silicon to react, and then removing any unreacted metal. However, it is very difficult to form a conformal silicide due to the poor conformality of the sputtered metal film, especially when the metal thickness is extremely thin. A thin silicide contact having appropriate sheet resistance, composition, phase formation, morphology and thermal stability may be formed by deposition of an appropriate metal on silicon to form an intermixed region between the metal and the silicon, removing any unintermixed metal from the intermixed region, and annealing the intermixed region to form the low resistive phase silicide contact. Formation of the intermixed region is a self-limiting process, and results in a silicide contact having a good conformality and uniformity.

Figure 1:
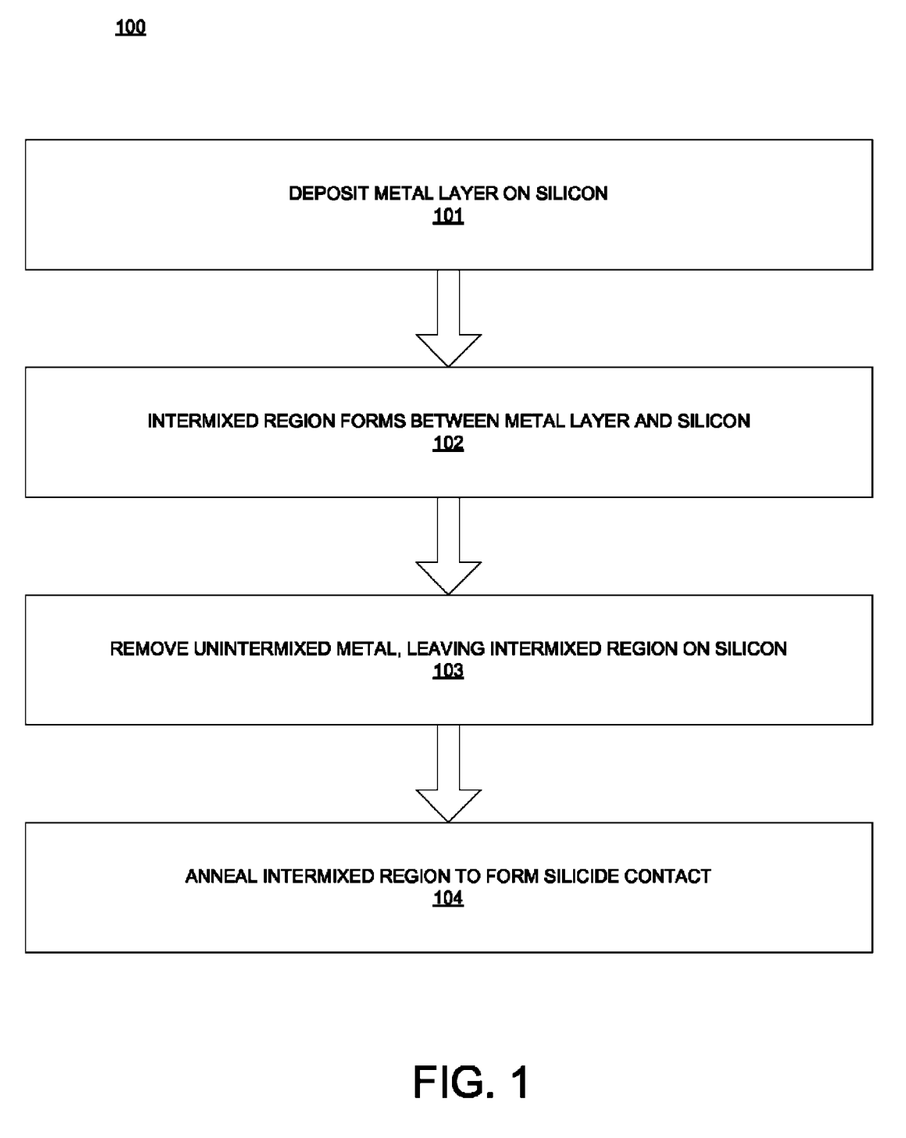
FIG. 1 illustrates an embodiment of a method for formation of a silicide contact.
Figure 2:
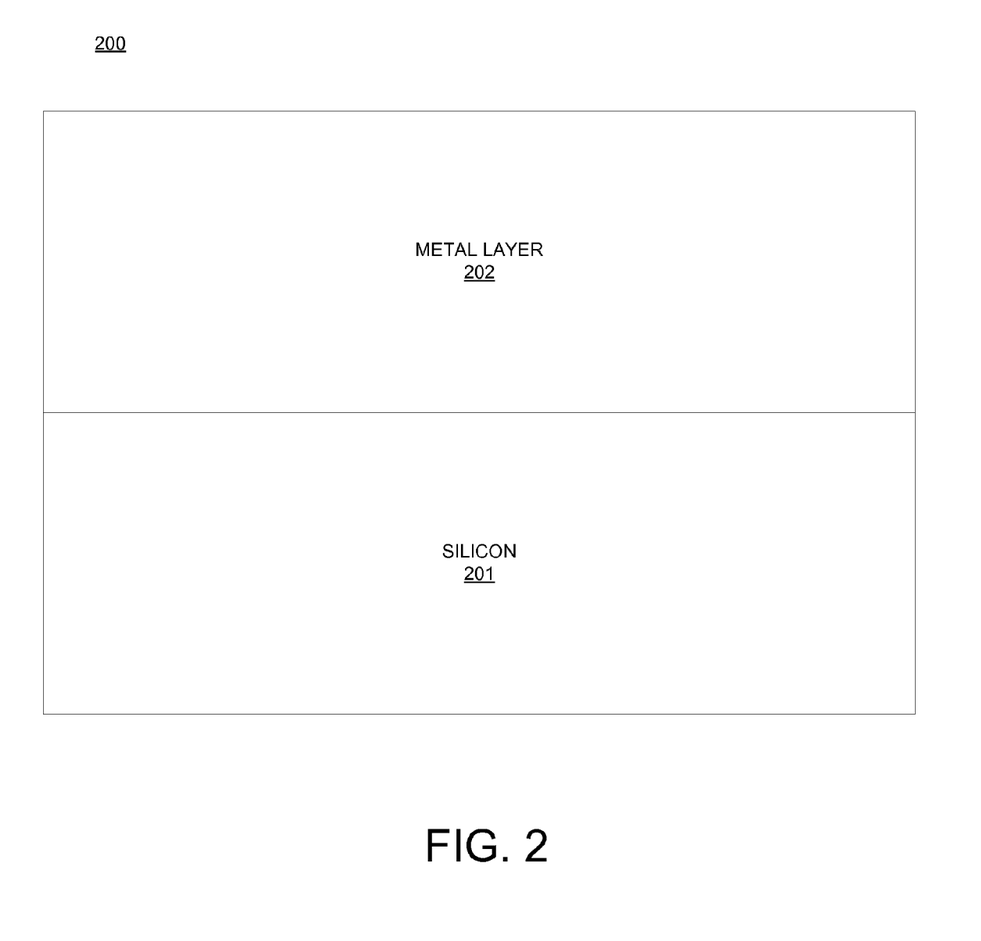
FIG. 2 illustrates an embodiment of a metal layer deposited on silicon.
Figure 3:
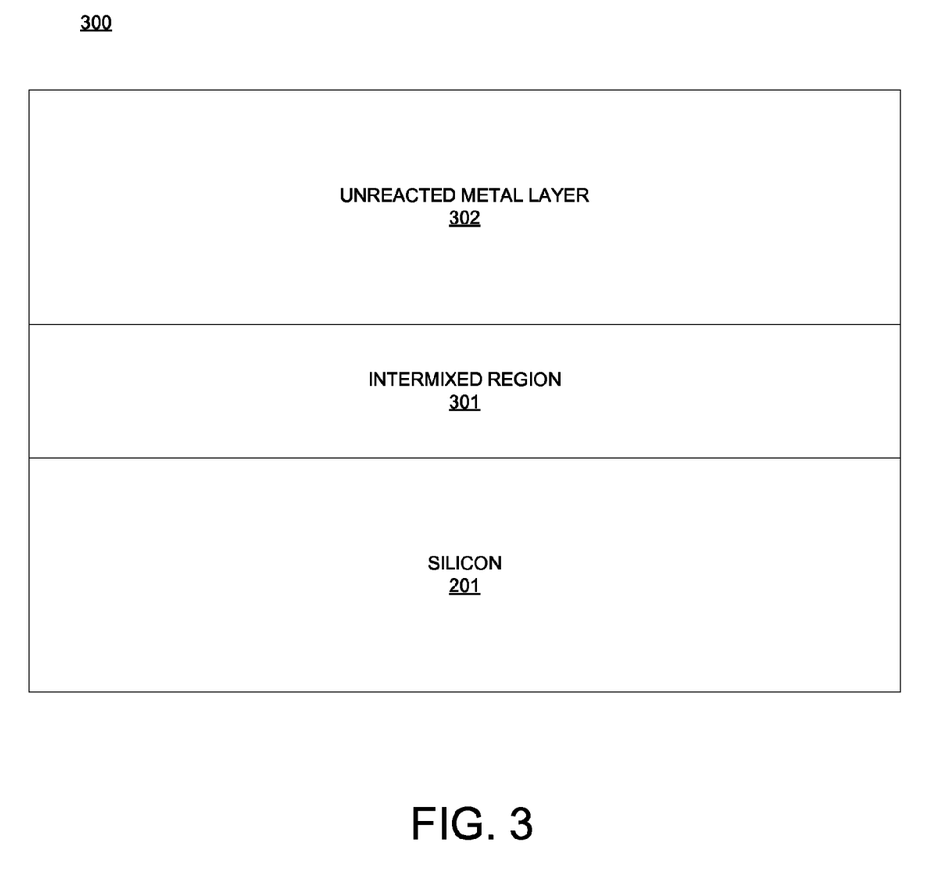
FIG. 3 illustrates an embodiment of the device of FIG. 2 after formation of a intermixed layer between the metal layer and the silicon.
Figure 4:
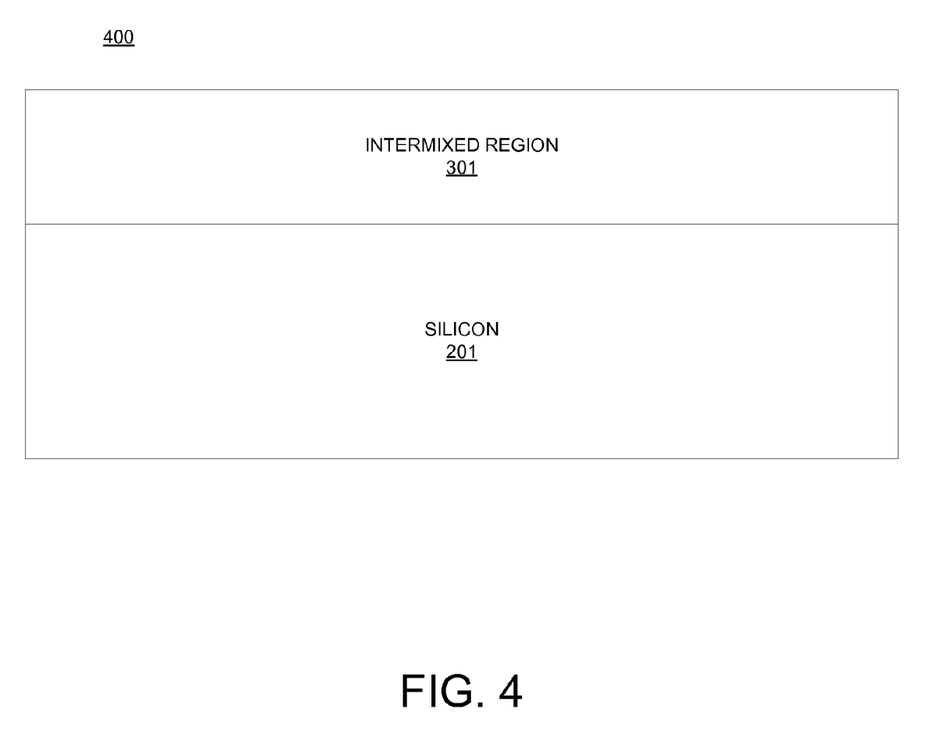
FIG. 4 illustrates an embodiment of the device of FIG. 3 after removal of the unintermixed metal layer from the intermixed layer.
Figure 5:
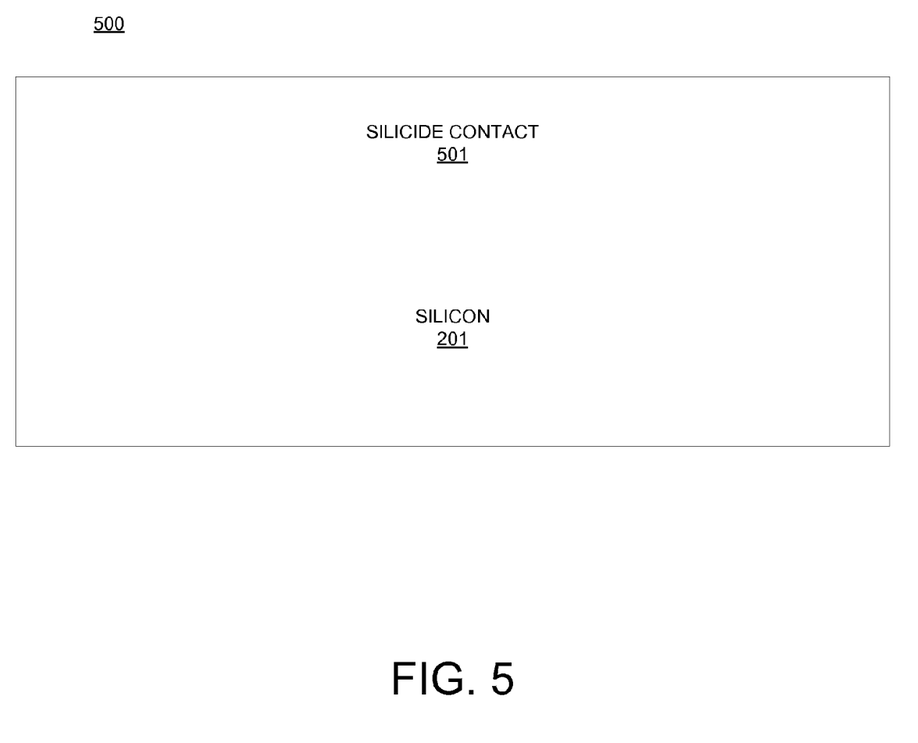
FIG. 5 illustrates an embodiment of a silicide contact after annealing.

FIG. 1 illustrates an embodiment of a method of forming a thin silicide contact. FIG. 1 is discussed with reference to FIGS. 2-5. In block 101, a metal layer 202 is deposited on silicon 201, as is shown in FIG. 2. Silicon 201 may comprise any silicon portion of any type semiconductor device that requires a contact in operation, and may comprise silicon-on-insulator (SOI) in some embodiments. Metal layer 202 may comprise nickel (Ni) or nickel platinum (NiPt) in some embodiments; if metal layer 202 comprises NiPt, the NiPt may comprise about 10% Pt in some embodiments. In block 102, metal layer 202 and silicon 201 intermix to form intermixed region 301 and unintermixed metal layer 302 on silicon 201, as shown in FIG. 3. The intermixed region 301 forms automatically just after the metal deposition; intermixing of metal layer 202 and silicon 201 is a self-limiting process. In block 103, the unintermixed metal layer 302 is stripped, leaving intermixed region 301 on silicon 201, as shown in FIG. 4. In block 104, the intermixed region 301 and silicon 201 of FIG. 4 are annealed, resulting in silicide contact 501 on silicon 201, as shown in FIG. 5. Silicide contact 501 comprises NiSi or NiPtSi in some embodiments. Silicide contact 501 may be used as an electrical contact for any appropriate semiconductor device, such as a MOSFET. A semiconductor device may comprise any appropriate number of silicide contacts.

Figure 6:
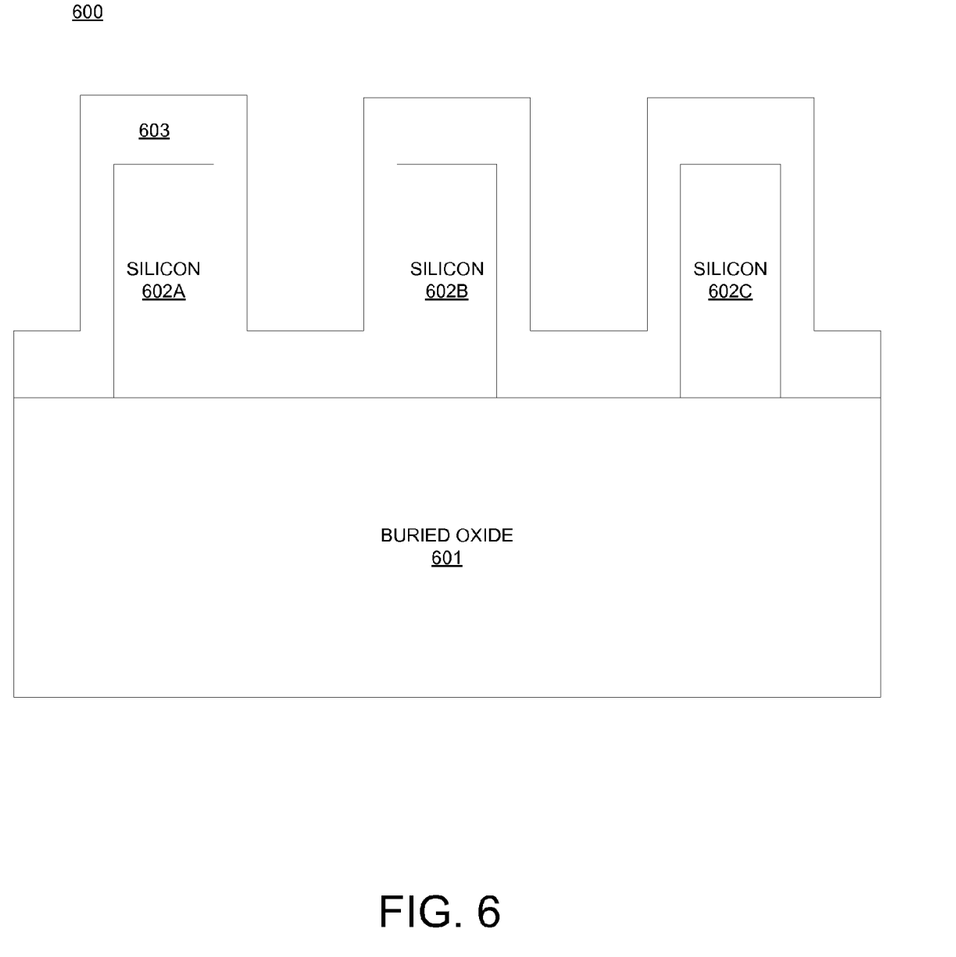
FIG. 6 illustrates an embodiment of a metal layer deposited on 3-D structured silicon on buried oxide.
Figure 7:
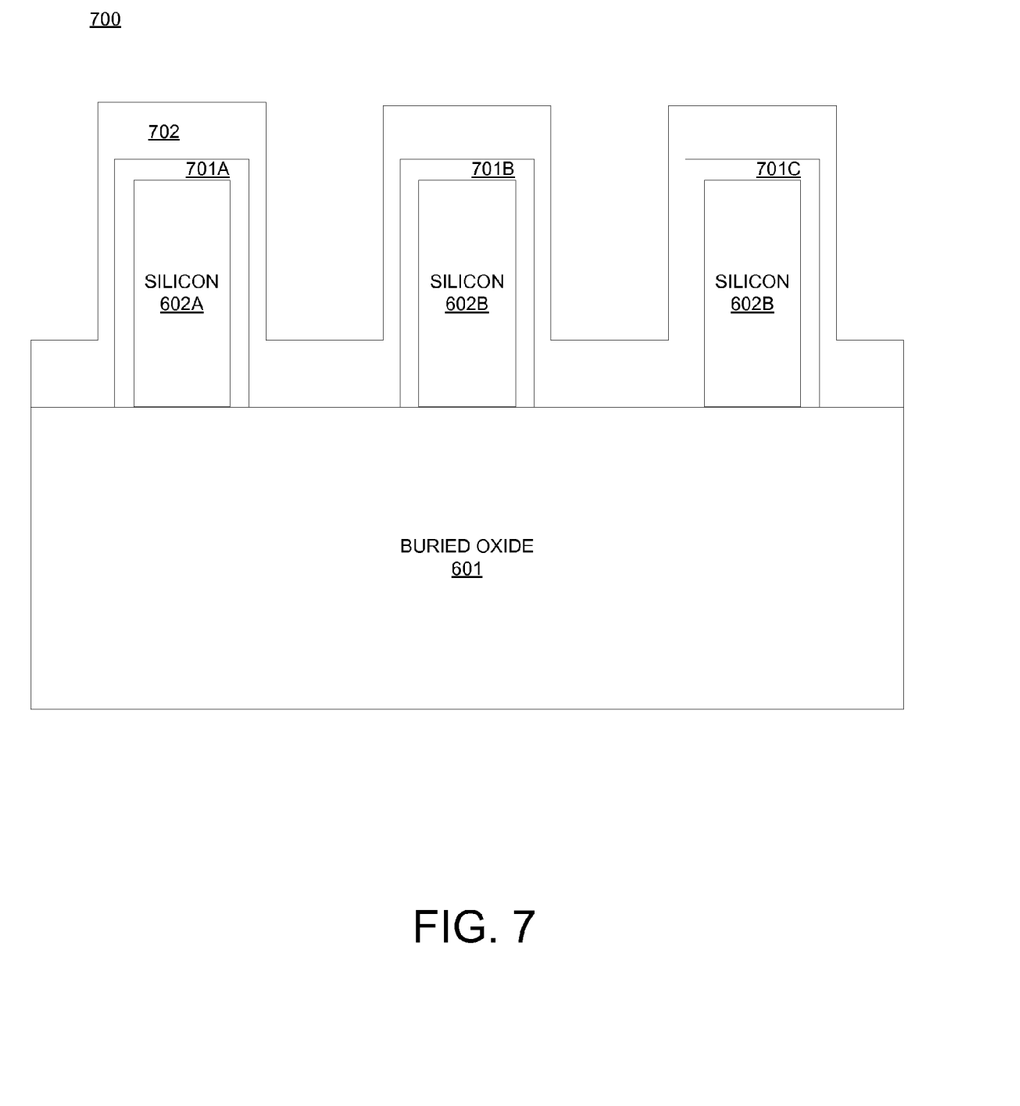
FIG. 7 illustrates an embodiment of the device of FIG. 6 after formation of a intermixed layer between the metal layer and the silicon.
Figure 8:
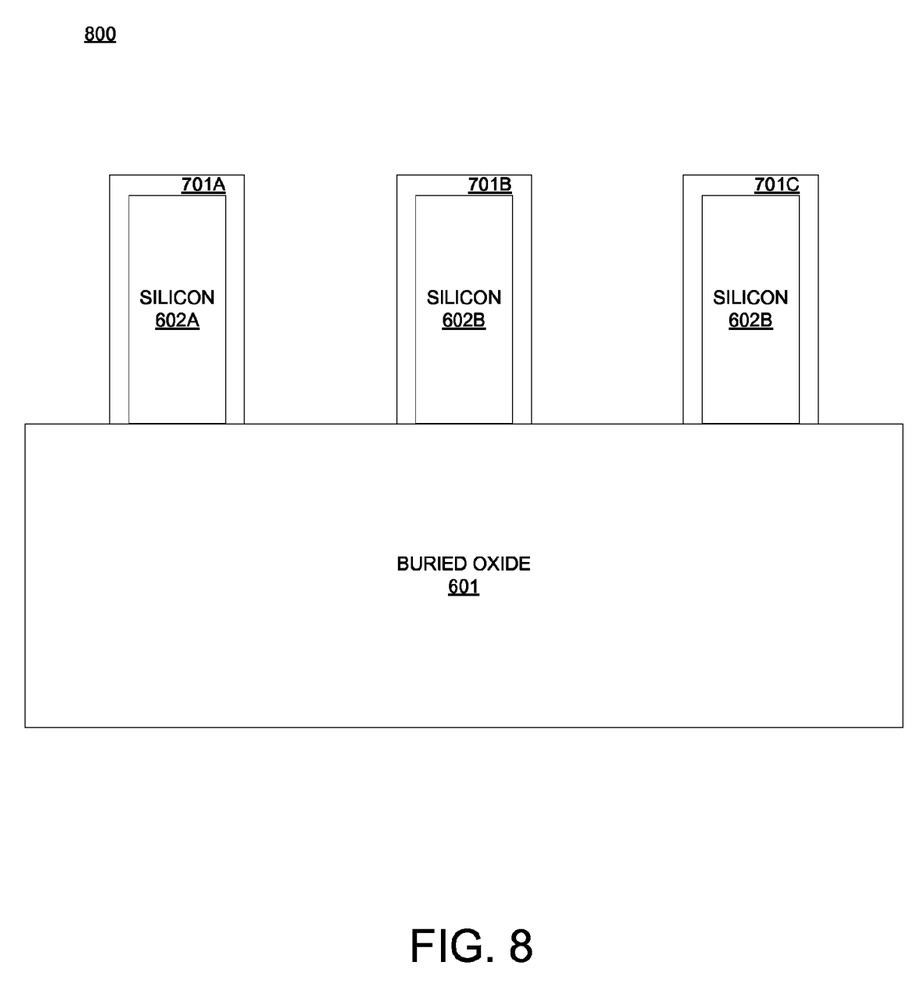
FIG. 8 illustrates an embodiment of the device of FIG. 7 after removal of the unintermixed metal layer from the intermixed layer.
Figure 9:
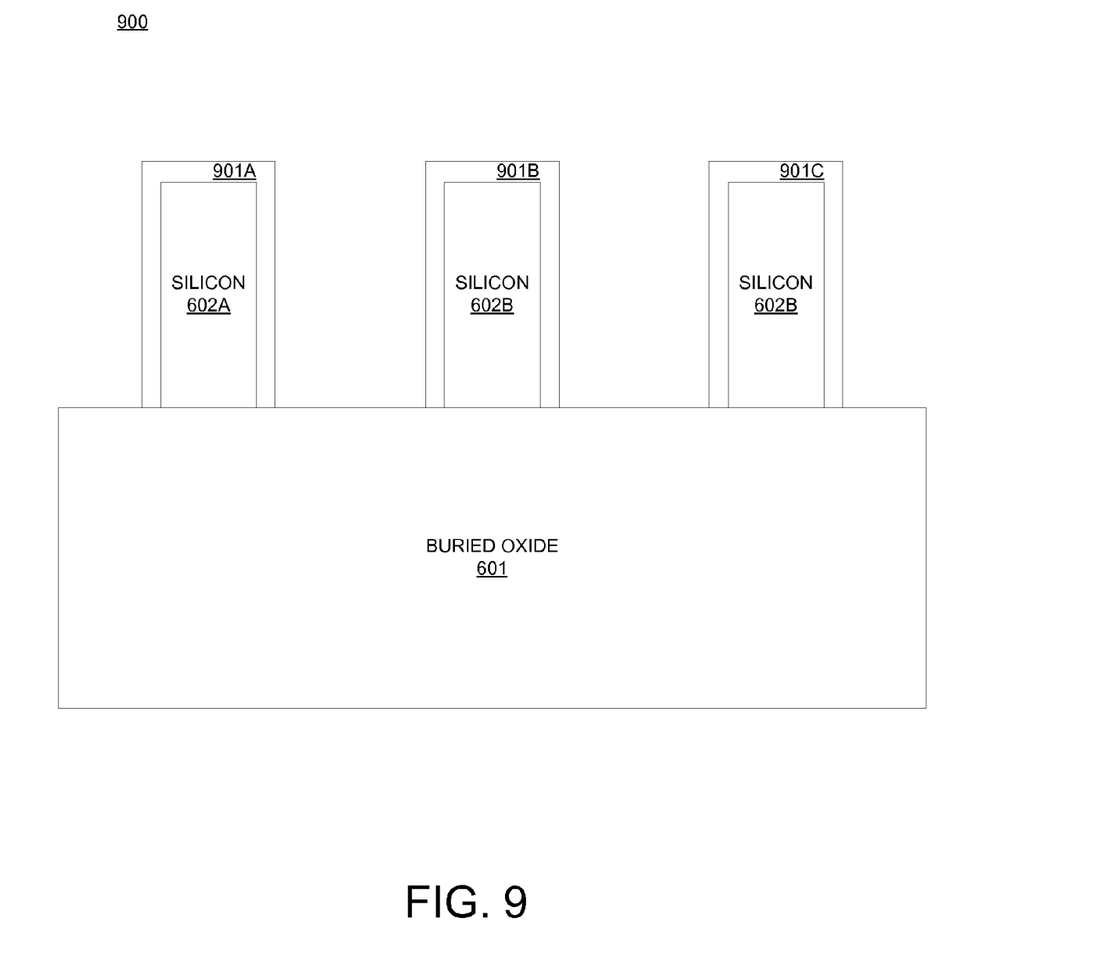
FIG. 9 illustrates an embodiment of conformal silicide contacts after annealing.

FIGS. 6-9 illustrate another embodiment of application of the method 100 of FIG. 1 for conformal formation of silicide contacts on a 3-dimensional silicon structure. In block 101, a metal layer 603 is deposited on 3-dimensional silicon 602A-C, which is located on buried oxide 601, as is shown in FIG. 6. Metal layer 603 may comprise nickel (Ni) or nickel platinum (NiPt) in some embodiments; if metal layer 603 comprises NiPt, the NiPt may comprise between about 10% Pt in some embodiments. In block 102, metal layer 603 and silicon 602A-C intermix to form intermixed regions 701A-C and unintermixed metal layer 702 on silicon 602A-C and buried oxide 601, as shown in FIG. 7. The intermixed regions 701A-C forms automatically just after the metal deposition; intermixing of metal layer 603 and silicon 602A-C is a self-limiting process. In block 103, the unintermixed metal layer 702 is stripped, leaving intermixed regions 701A-C on silicon 602A-C, as shown in FIG. 8. In block 104, the intermixed regions 701A-C are annealed, resulting in conformal silicide contacts 901A-C on 3-dimensional silicon structure 602A-C, as shown in FIG. 9. Silicide contacts 701A-C comprise NiSi or NiPtSi in some embodiments. Silicide contacts 701A-C may be used as an electrical contact for any appropriate semiconductor device, such as a MOSFET. A semiconductor device may comprise any appropriate number of silicide contacts.

The thickness of silicon 201 may have relatively little effect on the qualities (such as thickness and resistance) of silicide contact 501; however, the composition and thickness of metal layer 202 may cause wide variation in the thickness and resistance of silicide contact 501. Use of Ni for metal layer 202 may result in a silicide contact 501 that is epitaxial and has relatively good thermal stability, and also has a relatively uniform thickness. Use of Ni5% Pt for metal layer 202 may result in a silicide contact 501 that is not epitaxial, and may have poor uniformity in thickness. Use of Ni10% Pt may result in a non-epitaxial silicide contact 501 that may have better uniformity of thickness than a contact formed using a metal layer of Ni.

Table 1 below lists Ni amounts (in thicknesses) in the intermixed region that may result from depositing various thicknesses and compositions of metal layer onto silicon.

TABLE 1

| Deposited Metal layer thickness | Metal target composition (atm. %) | Ni amount in the intermix |
|---|---|---|
| 1 nanometer (nm) | Ni | about 10 angstroms (A) |
| 1 nm | Ni5% Pt | about 11 A |
| 1 nm | Ni10% Pt | about 11 A |
| 2 nm | Ni | about 16 A |
| 2 nm | Ni5% Pt | about 20 A |
| 2 nm | Ni10% Pt | about 21 A |
| 4 nm | Ni | about 16 A |
| 4 nm | Ni5% Pt | about 14 A |
| 4 nm | Ni10% Pt | about 14 A |
| 6 nm | Ni | about 16 A |
| 6 nm | Ni5% Pt | about 14 A |
| 6 nm | Ni10% Pt | about 14 A |
| 8 nm | Ni | about 15 A |
| 8 nm | Ni5% Pt | about 14 A |
| 8 nm | Ni10% Pt | about 15 A |
| 10 nm | Ni | about 16 A |
| 10 nm | Ni5% Pt | about 14 A |
| 10 nm | Ni10% Pt | about 15 A |
| 15 nm | Ni | about 17 A |
| 15 nm | Ni5% Pt | about 13 A |
| 15 nm | Ni10% Pt | about 15 A |
| 20 nm | Ni | about 17 A |
| 20 nm | Ni5% Pt | about 13 A |
| 20 nm | Ni10% Pt | about 15 A |

Table 2 below lists percentages of Pt in the intermixed region that may result from various thicknesses and compositions of the metal layer.

TABLE 2

| Deposited Metal layer thickness | Metal target composition (atm. %) | Intermixed region % Pt |
|---|---|---|
| 1 nm | Ni5% Pt | about 4.5% |
| 1 nm | Ni10% Pt | about 7% |
| 2 nm | Ni5% Pt | about 3.8% |
| 2 nm | Ni10% Pt | about 7% |
| 4 nm | Ni5% Pt | about 9% |
| 4 nm | Ni10% Pt | about 16% |
| 6 nm | Ni5% Pt | about 11% |
| 6 nm | Ni10% Pt | about 15.5% |
| 8 nm | Ni5% Pt | about 9.5% |
| 8 nm | Ni10% Pt | about 16% |
| 10 nm | Ni5% Pt | about 11% |
| 10 nm | Ni10% Pt | about 15.5% |
| 15 nm | Ni5% Pt | about 11% |
| 15 nm | Ni10% Pt | about 15.5% |
| 20 nm | Ni5% Pt | about 9% |
| 20 nm | Ni10% Pt | about 16% |

Table 3 below lists sheet resistances of a silicide contact that may result from various thicknesses and compositions of the metal layer. A relatively low resistance for silicide contact is desirable for efficient operation of the semiconductor device comprising the silicide contact.

TABLE 3

| Deposited Metal layer thickness | Metal target composition (atm. %) | Resistance of contact (Ω/□) |
|---|---|---|
| 1 nm | Ni | about 250 |
| 1 nm | Ni5% Pt | about 350 |
| 1 nm | Ni10% Pt | about 510 |
| 2 nm | Ni | about 150 |
| 2 nm | Ni5% Pt | about 150 |
| 2 nm | Ni10% Pt | about 260 |
| 4 nm | Ni | about 150 |
| 4 nm | Ni5% Pt | about 225 |
| 4 nm | Ni10% Pt | about 200 |
| 6 nm | Ni | about 150 |
| 6 nm | Ni5% Pt | about 200 |
| 6 nm | Ni10% Pt | about 200 |
| 8 nm | Ni | about 150 |
| 8 nm | Ni5% Pt | about 370 |
| 8 nm | Ni10% Pt | about 200 |
| 10 nm | Ni | about 150 |
| 10 nm | Ni5% Pt | about 200 |
| 10 nm | Ni10% Pt | about 200 |
| 15 nm | Ni | about 150 |
| 15 nm | Ni5% Pt | about 350 |
| 15 nm | Ni10% Pt | about 200 |
| 20 nm | Ni | about 150 |
| 20 nm | Ni5% Pt | about 250 |
| 20 nm | Ni10% Pt | about 200 |

The technical effects and benefits of exemplary embodiments include conformal formation of a relatively thin silicide contact in a self-limiting way for use in a semiconductor device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a silicide contact, the method comprising:
    depositing a metal layer on silicon such that the metal layer intermixes with the silicon to form an intermixed region on the silicon, wherein the intermixed region forms automatically after depositing the metal layer on the silicon;
    removing an unintermixed portion of the metal layer from the intermixed region before annealing the intermixed region to form silicide; and
    annealing the intermixed region to form silicide comprising a silicide contact on the silicon after removing the unintermixed portion of the metal layer.

2. The method of claim 1, wherein the metal layer comprises nickel (Ni).

3. The method of claim 2, wherein the metal layer has a thickness of 4 nanometers or more.

4. The method of claim 3, wherein the silicide contact has a sheet resistance of about 150Ω/☐.

5. The method of claim 2, wherein the silicide contact is epitaxial.

6. The method of claim 1, wherein the metal layer comprises nickel platinum (NiPt).

7. The method of claim 6, wherein the metal layer comprises 10% Pt.

8. The method of claim 7, wherein the metal layer has a thickness of about 4 nanometers or more.

9. The method of claim 8, wherein the silicide contact comprises about 16% Pt.

10. The method of claim 8, wherein the silicide contact has a sheet resistance of about 200Ω/☐.

11. The method of claim 6, wherein the silicide contact is non-epitaxial.

12. The method of claim 1, further comprising forming an electrical connection to the silicide contact to power a field effect transistor (FET).

13. The method of claim 1, wherein the silicon comprises a 3-dimensional silicon structure, and wherein the silicide contact comprises a conformal silicide contact.

* * * * *